United States Patent
Takasu

(10) Patent No.: US 7,880,240 B2
(45) Date of Patent: Feb. 1, 2011

(54) SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/070,132

(22) Filed: Feb. 15, 2008

(65) Prior Publication Data
US 2008/0197425 A1 Aug. 21, 2008

(30) Foreign Application Priority Data
Feb. 17, 2007 (JP) ............................. 2007-037226

(51) Int. Cl.
*H01L 29/66* (2006.01)
(52) U.S. Cl. .................. 257/409; 257/452; 257/372; 257/E29.012; 257/E29.063; 438/70; 438/140; 438/294; 438/419
(58) Field of Classification Search ................ 257/127, 257/170, 181, 409, 452, 484, 605, E29.012, 257/E29.013, 372, 373, 386, 394, 503, 547, 257/630, 500, 502, 375, 376; 438/70, 140, 438/294, 419
See application file for complete search history.

(56) References Cited

U.S. PATENT DOCUMENTS 5,164,803 A * 11/1992 Ozaki et al. ................. 257/372
2001/0009290 A1 * 7/2001 Wong ......................... 257/369
2002/0024058 A1 * 2/2002 Marshall et al. ............. 257/170
2002/0074608 A1 * 6/2002 Aoki et al. .................. 257/376
2002/0135030 A1 * 9/2002 Horikawa .................... 257/405
2006/0099753 A1 * 5/2006 Chen et al. .................. 438/199
2006/0226499 A1 * 10/2006 Shimizu ...................... 257/409

FOREIGN PATENT DOCUMENTS

JP 2000058673 2/2000

* cited by examiner

*Primary Examiner*—Lynne A Gurley
*Assistant Examiner*—Yosef Gebreyesus
(74) *Attorney, Agent, or Firm*—Adams & Wilks

(57) ABSTRACT

A semiconductor device has a high voltage circuit section disposed on a semiconductor substrate having a first conductivity. The high voltage circuit section has a well region with a second conductivity, a first heavily doped impurity region with the first conductivity and disposed on the well region, a second heavily doped impurity region having a second conductivity and disposed on the semiconductor substrate, a trench isolation region disposed between the first and second heavily doped impurity regions, and an interconnect disposed over the trench isolation region. First and second electrodes are disposed above the trench isolation region, below the interconnect, and on opposite sides of a junction between the well region and the semiconductor substrate. The first electrode is disposed above the semiconductor substrate, and the second electrode is disposed above the well region. The first and second electrodes prevent parasitic formation of an inverse layer on a surface of the semiconductor substrate due to a potential of the interconnect.

13 Claims, 2 Drawing Sheets

Prior Art

SEMICONDUCTOR DEVICE

BACKGROUND OF THE INVENTION

1. Field of the Invention

The present invention relates to a semiconductor device having a trench isolation structure used in a CMOS device and the like having multiple power supply voltages.

2. Description of the Related Art

In a semiconductor device having a CMOS device which uses multiple power supply voltages, it is important to improve a degree of integration of a low voltage section forming an internal circuit such as a logic circuit, and at the same time, to prevent formation of parasitic transistors in the device isolation region to secure latch-up resistance of a high voltage section used for an input/output circuit or the like.

In recent years, the device isolation is carried out by trench isolation which is more suitable for higher integration than LOCOS isolation in many cases. In LOCOS, however, a heavily doped impurity region for preventing parasitic channel, that is, a so-called channel stopper region or a field dope region can be easily formed to prevent inversion of a semiconductor substrate, and thus, the device isolation characteristic for a high voltage circuit is excellent. On the other hand, a semiconductor device in which trench isolation is used for device isolation has a problem in that, due to a potential of a interconnect which passes above the trench isolation region, a parasitic channel can be formed easily because a parasitic inversion layer is formed on the surface of a semiconductor substrate in the lower part of the trench isolation region, leading to a problem of, in particular, forming a high voltage power supply circuit section.

The formation of an inversion layer and a parasitic channel, and latch-up caused by the formation of the inversion layer and the parasitic channel, are described with reference to FIG. 3.

FIG. 3 is a schematic cross sectional view illustrating a part of a high voltage circuit section of a conventional semiconductor device.

A p-well region 201 of a p-type lightly doped impurity region as a first well region and an n-well region 202 of an n-type lightly doped impurity region as a second well region are formed side by side on a p-type silicon substrate 101 as a semiconductor substrate of a first conductivity type. An n-type heavily doped impurity region 501 which is a source and/or a drain region of an n-type MOS transistor, for example, is formed on a surface of the p-well region 201, while a p-type heavily doped impurity region 502 which is a source and/or a drain region of a p-type MOS transistor, for example, is formed on a surface of the n-well region 202. A trench isolation region 301 for device isolation is formed between the n-type heavily doped impurity region 501 and the p-type heavily doped impurity region 502. An interconnect 901 formed of aluminum or the like for electrically connecting the elements is disposed thereabove via a first insulating film 601 which is a silicon oxide film or the like.

In a high voltage circuit in which a power supply voltage of 30 V, for example, is used, a potential of 30 V is sometimes applied to the interconnect 901. Since the potential of the p-well region 201 is fixed at the ground level (0 V), an n-type inversion layer 911 is easily formed under the trench isolation region 301 in the p-well region 201. Then, a parasitic transistor formed of the n-type heavily doped impurity region 501, the n-type inversion layer 911, and the n-well region 202 is brought into conduction to permit on-state current. Due to a rise in the potential of the n-well region 202 caused by the on-state current, a vertical parasitic PNP transistor formed of the p-type heavily doped impurity region 502, the n-well region 202, and the p-type silicon substrate 101 is turned on. This causes a potential drop of the p-well region 201, and a so-called latch-up phenomenon occurs.

However, in order to secure enough latch-up resistance for a high voltage circuit section, it is necessary to increase the depth of a well to suppress parasitic bipolar action, and, in order to reduce leakage current between an NMOS transistor and a PMOS transistor and to secure high voltage withstand characteristics, it is necessary to make the width of a trench isolation section larger. Therefore, there is a problem that, when the low voltage circuit section uses the same trench isolation structure as the trench isolation structure of the high voltage circuit section, the degree of integration of a device in the low voltage section which is required to be higher reduces.

As measures for improvement thereof, a method of making the depth of a well of the high voltage circuit section larger than the depth of a well of the low voltage circuit section or a method of making the width of a trench isolation section of the high voltage circuit section larger than the width of a trench isolation section of the low voltage circuit section is proposed (see JP 2000-58673 A, for example).

As described above, however, in a semiconductor device with multiple power supply voltages whose elements are isolated by trench isolation, in order to secure enough latch-up resistance for a high voltage circuit section, it is necessary to increase the depth of a well to suppress parasitic bipolar action, and, in order to reduce leak current between an NMOS transistor and a PMOS transistor and to secure high voltage withstanding characteristics against inversion, it is necessary to make the width of a trench isolation section wider. Accordingly, there is a problem in that, when the low voltage circuit section uses the same trench isolation structure as the trench isolation structure of the high-voltage circuit section, the degree of integration of devices in the low voltage section reduces against the demand for high integration.

Though an improvement has been proposed in which the depth of a well of the high voltage circuit section is made larger than the depth of a well of the low voltage circuit section or the width of a trench isolation section of the high voltage circuit section is made larger than the width of a trench isolation section of the low voltage circuit section, there are problems in that the number of the manufacturing steps increases and that the increase in the width of a trench isolation section leads to increase in cost.

SUMMARY OF THE INVENTION

In order to solve the above-mentioned problems, according to the present invention, a semiconductor device is structured as described below.

According to the present invention, there is provided a semiconductor device including: a high voltage circuit section and a low voltage circuit section formed on a semiconductor substrate; a trench isolation structure which isolates an element in the high voltage circuit section and an element in the low voltage circuit section, the high voltage circuit section including: at least one well region; a MOS transistor; and interconnects for electrically connecting the respective devices; and an electrode for preventing inversion layer formation provided in a region above the trench isolation region provided near an end section of the at least one well region and below the interconnect, for preventing parasitic formation of an inversion layer on a surface of the semiconductor substrate due to a potential of the interconnect.

The potential of the electrode for preventing inversion layer formation is the same as the potential of the semiconductor substrate positioned therebelow.

Further, a guard ring region formed of a heavily doped impurity region of the same conductivity type as the semiconductor substrate is provided below the electrode for preventing inversion layer formation and is electrically connected thereto so that the potential of the semiconductor substrate is firmly fixed and that, when bipolar action occurs, carriers are captured to prevent latch-up.

Owing to the above-mentioned means, there can be provided a semiconductor device in which the number of the manufacturing steps is not increased, enough device isolation characteristics and latch-up resistance are secured for the high voltage circuit section, and the degree of integration is high while the low voltage circuit section uses the same trench isolation structure as the high voltage circuit section.

DETAILED DESCRIPTION OF THE PREFERRED EMBODIMENTS

Embodiment 1

Figure 1:
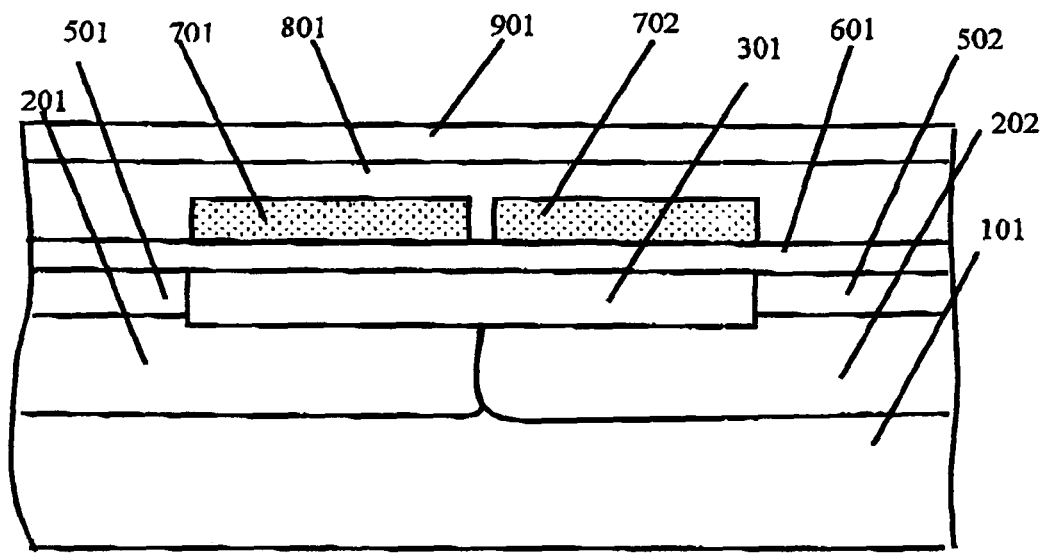
FIG. 1 is a schematic cross sectional view illustrating a first embodiment of a high voltage circuit section of a semiconductor device according to the present invention.

FIG. 1 is a schematic cross sectional view illustrating a first embodiment of a high voltage circuit section of a semiconductor device according to the present invention.

A p-well region 201 of a p-type lightly doped impurity region as a first well and an n-well region 202 of an n-type lightly doped impurity region as a second well are formed side by side on a surface of a p-type silicon substrate 101 as a semiconductor substrate of a first conductivity type. An n-type heavily doped impurity region 501 which is a source and/or a drain region of an n-type MOS transistor, for example, is formed on a surface of the p-well region 201, while a p-type heavily doped impurity region 502 which is a source and/or a drain region of a p-type MOS transistor, for example, is formed on a surface of the n-well region 202. A trench isolation region 301 for device isolation is formed between the n-type heavily doped impurity region 501 and the p-type heavily doped impurity region 502.

An electrode 701 for preventing n-type inversion layer formation, which is formed of a thin film of polycrystalline silicon or metal which is the same thin film as that forming a gate electrodes of a MOS transistor, is formed above the trench isolation region 301 for device isolation on the p-well region 201 via a first insulating film 601 which is a silicon oxide film or the like along the junction surface with the n-well. Although not shown, the electrode 701 for preventing n-type inversion layer formation is connected to the same potential as that of the p-well region 201 and fixed, for example, at the ground level.

An electrode 702 for preventing p-type inversion layer formation, which is formed of a thin film of polycrystalline silicon or metal which is the same thin film as that forming a gate electrodes of a MOS transistor, is formed above the trench isolation region 301 for device isolation on the n-well region 202 via the first insulating film 601 which is a silicon oxide film or the like along the junction surface with the p-well. Although not shown, the electrode 702 for preventing p-type inversion layer formation is connected to the same potential as that of the n-well region 202 and fixed, for example, at the power supply voltage.

An interconnect 901 formed of aluminum or the like for electrically connecting the devices is formed above the electrode 701 for preventing n-type inversion layer formation and the electrode 702 for preventing p-type inversion layer formation via a second insulating film 801.

Here, when a potential as high as 30 V, for example, is applied to the interconnect 901, no n-type inversion layer is formed on the surface of the p-well region 201 since the electrode 701 for preventing n-type inversion layer formation is disposed between the interconnect 901 and the p-well region 201 and the potential of the electrode 701 for preventing n-type inversion layer formation is fixed to the same potential as that of the p-well region 201.

When a potential as low as 0 V, for example, is applied to the interconnect 901, because a potential difference between the interconnect 901 and the surface of the n-well region 202 which is fixed to a power supply voltage as high as 30 V, for example, is large, there is a possibility that a p-type inversion layer may be formed on the surface of the n-well region 202. According to the present invention, however, no p-type inversion layer is formed on the surface of the n-well region 202 since the electrode 702 for preventing p-type inversion layer formation is disposed between the interconnect 901 and the n-well region 202 and the potential of the electrode 702 for preventing p-type inversion layer formation is fixed to the same potential as that of the n-well region 202, even when a relatively low potential compared to the n-well region 202 is applied to the interconnect 901.

As described above, according to the present invention, formation of an inversion layer can be effectively prevented, and occurrence of presumed latch-up thereof can be prevented in advance.

The first insulating film 601 exists in the embodiment illustrated in FIG. 1, but the first insulating film 601 is not necessarily required.

Further, with regard to the combination of the semiconductor substrate and the well region, in the embodiment illustrated in FIG. 1, the p-type silicon substrate is the semiconductor substrate of the first conductivity type, the p-well is the first well, and the n-well is the second well. However, in a case where an n-type silicon substrate is the semiconductor substrate of the first conductivity type, an n-well is the first well, and a p-well is the second well, the polarities thereof can be opposite to the polarities of the embodiment illustrated in FIG. 1.

When the semiconductor device is structured to have well regions of only one conductivity type, for example, when a p-type silicon substrate is the semiconductor substrate of the first conductivity type and an n-well is the second well, by regarding the p-type silicon substrate as the p-well region 201 of the embodiment illustrated in FIG. 1, similar effects can be produced. In the same way, in a case where an n-type silicon substrate is the semiconductor substrate of the first conductivity type and a p-well is the second well, which is an opposite combination and similar to the case where an n-type silicon substrate is the semiconductor substrate of the first conductivity type, an n-well is the first well, and a p-well is the second well, their polarities may be made opposite.

It should be noted that a low operating voltage in the low voltage circuit section (not shown) of the semiconductor device according to the present invention makes it possible for the occurrence of parasitic bipolar action and latch-up to be low. No need for the electrode for preventing inversion layer formation, which is described above, accordingly permits higher integration.

Embodiment 2

Figure 2:
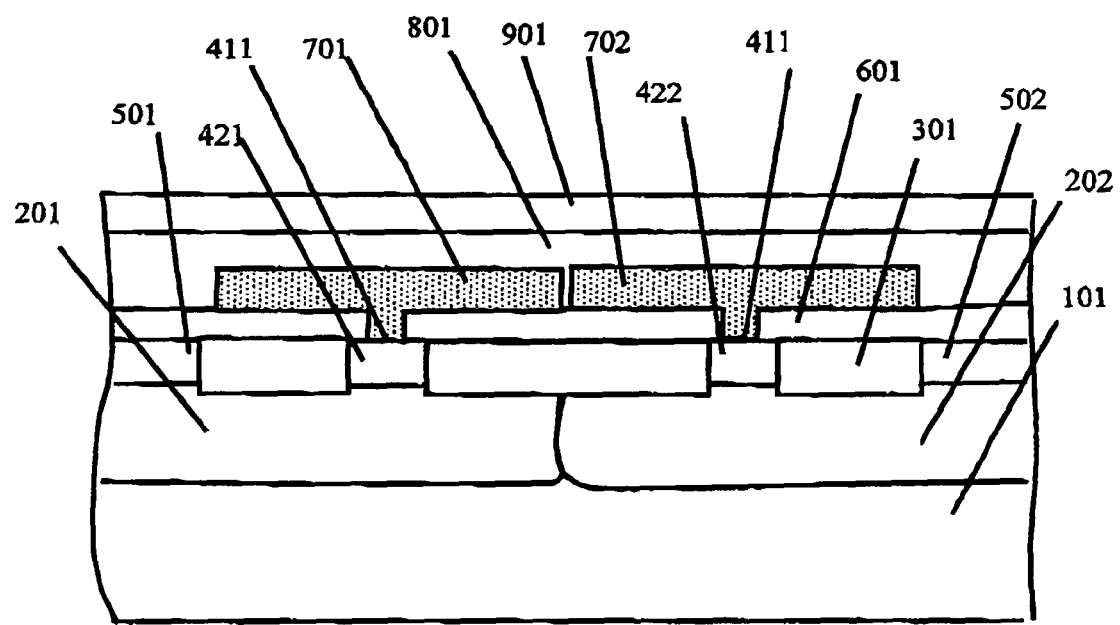
FIG. 2 is a schematic cross sectional view illustrating a second embodiment of a high voltage circuit section of a semiconductor device according to the present invention.
Figure 3:
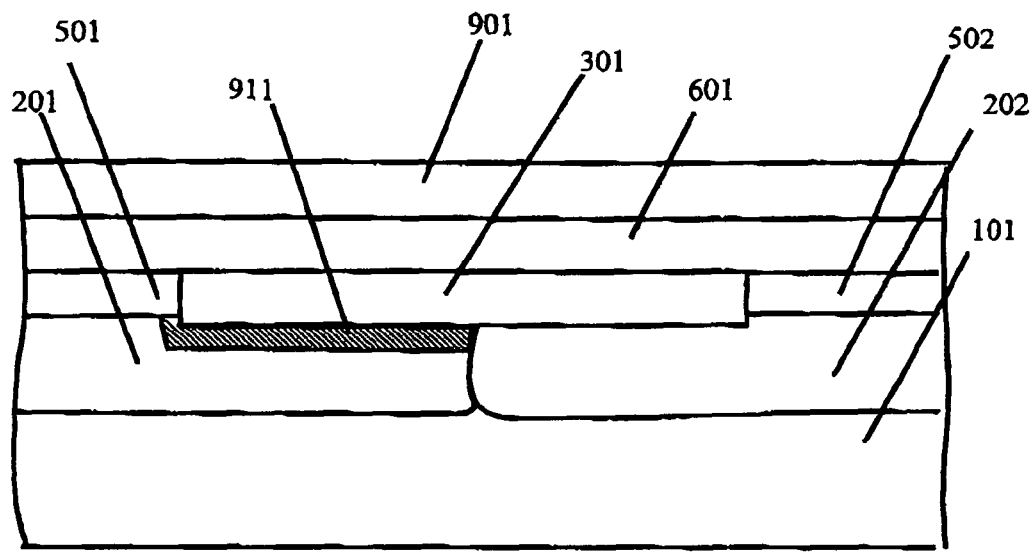
FIG. 3 is a schematic cross sectional view illustrating a part of a high voltage circuit section of a conventional semiconductor device.

FIG. 2 is a schematic cross sectional view illustrating a second embodiment of a high voltage circuit section of a semiconductor device according to the present invention.

A p-well region 201 of a p-type lightly doped impurity region as a first well and an n-well region 202 of an n-type lightly doped impurity region as a second well are formed side by side on a p-type silicon substrate 101 as a semiconductor substrate of a first conductivity type. An n-type heavily doped impurity region 501 which is a source and/or a drain region of n-type MOS transistor, for example, is formed on a surface of the p-well region 201, while a p-type heavily doped impurity region 502 which is a source and/or a drain region of p-type MOS transistor, for example, is formed on a surface of the n-well region 202. A trench isolation region 301 for element isolation is formed between the n-type heavily doped impurity region 501 and the p-type heavily doped impurity region 502.

This embodiment differs from the embodiment illustrated in FIG. 1: in that a p-type guard ring region 421 of a heavily doped impurity region, which is the same conductivity type as the p-well region 201, is formed on the surface of the p-well region 201 and below the electrode 701 for preventing n-type inversion layer formation formed via the first insulating film 601 and is electrically connected to the electrode 701 for preventing n-type inversion layer formation via a contact region 411 for firmly fixing the potential of the p-well region 201 and for capturing carriers to prevent latch-up when bipolar action occurs; and in that an n-type guard ring region 422 of a heavily doped impurity region, which has the same conductivity type as the n-well region 202, is formed on the surface of the n-well region 202 and below the electrode 702 for preventing p-type inversion layer formation formed via the first insulating film 601 and is electrically connected to the electrode 702 for preventing p-type inversion layer formation via the contact region 411 for firmly fixing the potential of the n-well region 202 and for capturing carriers to prevent latch-up when bipolar action occurs.

A interconnect 901 formed of aluminum or the like for electrically connecting the devices is formed above the electrode 701 for preventing n-type inversion layer formation and the electrode 702 for preventing p-type inversion layer formation via a second insulating film 801.

Here, when a potential as high as 30 V, for example, is applied to the interconnect 901, no n-type inversion layer is formed on the surface of the p-well region 201 since the electrode 701 for preventing n-type inversion layer formation is disposed between the interconnect 901 and the p-well region 201 and because the electrode 701 for preventing n-type inversion layer formation is electrically connected to the p-type guard ring region 421 of a heavily doped impurity region having the same conductivity type as the p-well region 201 for firmly fixing the potential of the p-well region 201 placed therebelow and for capturing carriers to prevent latch-up when bipolar action occurs, the potential of the electrode 701 for preventing n-type inversion layer formation is fixed to the same potential as that of the p-well region 201.

When a potential as low as 0 V, for example, is applied to the interconnect 901, because a potential difference between the interconnect 901 and the surface of the n-well region 202 which is fixed to a power supply voltage as high as 30 V, for examples is large, there is a possibility that a p-type inversion layer may be formed on the surface of the n-well region 202. According to the present invention, however, no p-type inversion layer is formed on the surface of the n-well region 202 since the electrode 702 for preventing p-type inversion layer formation is disposed between the interconnect 901 and the n-well region 202 and because the electrode 702 for preventing p-type inversion layer formation is electrically connected to the n-type guard ring region 422 of a heavily doped impurity region, which has the same conductivity type as that of the n-well region 202, for firmly fixing the potential of the n-well region 202 placed therebelow and for capturing carriers to prevent latch-up when bipolar action occurs, the potential of the p-type electrode 702 for preventing inversion layer formation is fixed to be the same as the potential of the n-well region 202.

In the embodiment shown in FIG. 2, because, in addition to the embodiment shown in FIG. 1, the p-type guard ring region 421 and the n-type guard ring region 422 which act as guard rings for firmly fixing the potentials of the p-well region 201 and the n-well region 202 and for capturing carriers to prevent latch-up when bipolar action occurs, the latch-up resistance can be further improved compared with the embodiment illustrated in FIG. 1. Further, because the p-type guard ring region 421 and the n-type guard ring region 422 are disposed below the electrode 701 for preventing n-type inversion layer formation and the electrode 702 for preventing p-type inversion layer formation, respectively, no additional area is needed and no increase in cost occurs.

It should be noted that, with regard to the combination of the semiconductor substrate and the well region, similarly to the embodiment illustrated in FIG. 1, several combinations are possible, and description thereof is omitted here.

With regard to other members, like numerals are used to designate like or identical members illustrated in FIG. 1, and description thereof is also omitted here.

As described above, according to the present invention, there can be obtained a semiconductor device in which the number of the manufacturing steps is not increased, enough device isolation characteristics and latch-up resistance are secured for the high voltage circuit section, and the scale of integration is large while the low voltage circuit section uses the same trench isolation structure as the trench isolation structure of the high voltage circuit section.

What is claimed is:

1. A semiconductor device, comprising:
   a semiconductor substrate having a first conductivity; and
   a high voltage circuit section disposed on the semiconductor substrate, the high voltage circuit section comprising a well region having a second conductivity, a first heavily doped impurity region having the first conductivity and disposed on the well region, a second heavily doped impurity region having the second conductivity and disposed on the semiconductor substrate, a trench isolation region disposed between the first and second heavily doped impurity regions, an interconnect disposed over the trench isolation region, and first and second electrodes for preventing parasitic formation of an inverse layer on a surface of the semiconductor substrate due to a potential of the interconnect, the first and second electrodes being disposed above the trench isolation region, below the interconnect, and above a junction between the well region and the semiconductor substrate, the first electrode being disposed above the semiconductor substrate, and the second electrode being disposed above the well region.

2. A semiconductor device according to claim 1; wherein a potential of the first electrode is the same as a potential of the semiconductor substrate; and wherein a potential of the second electrode is the same as a potential of the well region.

3. A semiconductor device according to claim 1; further comprising:
a first guard ring region for firmly fixing a potential of the semiconductor substrate and capturing carriers to prevent latch-up during occurrence of a bipolar action, the first guard ring region being formed of a heavily doped impurity region of the first conductivity, being disposed above the semiconductor substrate, and being disposed below and electrically connected to the first electrode; and
a second guard ring region for firmly fixing the potential of the well region and capturing carriers to prevent latch-up during occurrence of a bipolar action, the second guard ring region being formed of a heavily doped impurity region of the second conductivity, being disposed above the well region, and being disposed below and electrically connected to the second electrode.

4. A semiconductor device according to claim 1; wherein the first and second electrodes are formed of the same thin film as a thin film forming a gate electrode of a MOS transistor formed in the high voltage circuit section.

5. A semiconductor device comprising:
a semiconductor substrate; and
a high voltage circuit section disposed on the semiconductor substrate, the high voltage circuit section comprising a first well region having a first conductivity, a first heavily doped impurity region having a second conductivity and disposed on the first well region, a second well region having the second conductivity and disposed adjacent to the first well region, a second heavily doped impurity region having the first conductivity and disposed on the second well region, a trench isolation region disposed between the first and second heavily doped impurity regions, an interconnect disposed over the trench isolation region, and first and second electrodes for preventing parasitic formation of an inversion layer on a surface of the semiconductor substrate due to a potential of the interconnect, the first and second electrodes being disposed above the trench isolation region, below the interconnect, and on opposite sides of a junction between the first and second well regions, the first electrode being disposed above the first well region, and the second electrode being disposed above the second well region.

6. A semiconductor device according to claim 5;
wherein a potential of the first electrode is the same as a potential of the first well region; and
wherein a potential of the second electrode is the same as a potential of the second well region.

7. A semiconductor device according to claim 5; further comprising:

a first guard ring region for firmly fixing a potential of the first well region and capturing carriers to prevent latch-up during occurrence of a bipolar action, the first guard ring region being formed of a heavily doped impurity region of the first conductivity, being disposed above the first well region, and being disposed below and electrically connected to the first electrode; and
a second guard ring region for firmly fixing a potential of the first well region and capturing carriers to prevent latch-up during occurrence of a bipolar action, the first guard ring region being formed of a heavily doped impurity region of the second conductivity, being disposed above the second well region, and being disposed below and electrically connected to the second electrode.

8. A semiconductor device comprising:
a semiconductor substrate;
first and second well regions formed on a surface of the semiconductor substrate;
a first heavily doped impurity region disposed on the first well region;
a second heavily doped impurity region disposed on the second well region;
a trench isolation region disposed between the first and second heavily doped impurity regions;
an interconnect disposed over the trench isolation region;
first and second electrodes disposed over the first and second well regions, respectively, for preventing parasitic formation of an inversion layer on the surface of the semiconductor substrate due to a potential of the interconnect; and
first and second guard ring regions disposed below and electrically connected to the first and second electrodes, respectively, for fixing potentials of the first and second well regions, respectively, and capturing carriers to prevent latch-up during a bipolar action.

9. A semiconductor device according to claim 8; wherein the first and second electrodes are disposed above the trench isolation region, below the interconnect, and on opposite sides of a junction between the first and second well regions.

10. A semiconductor device according to claim 8; wherein the first and second guard ring regions are disposed above the first and second well regions, respectively.

11. A semiconductor device according to claim 8; wherein a potential of the first electrode is the same as a potential of the first well region; and wherein a potential of the second electrode is the same as a potential of the second well region.

12. A semiconductor device according to claim 8; further comprising a MOS transistor; and wherein the first and second electrodes are formed of the same thin film as a thin film forming a gate electrode of the MOS transistor.

13. A semiconductor device according to claim 8; wherein each of the semiconductor substrate, the first well region, and the second heavily doped impurity region has a first conductivity type; and wherein the second well region and the first heavily doped impurity region has a second conductivity type different from the first conductivity type.

* * * * *